(12) United States Patent
Mulder et al.

(10) Patent No.: US 6,642,794 B2
(45) Date of Patent: Nov. 4, 2003

(54) NOISE AND INPUT IMPEDANCE MATCHED AMPLIFIER

(75) Inventors: Jan Mulder, Houten (NL); Dominicus Martinus Wilhelmus Leenaerts, Eindhoven (NL); Edwin Van Der Heijden, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/920,117

(22) Filed: Aug. 1, 2001

(65) Prior Publication Data

US 2002/0047747 A1 Apr. 25, 2002

(30) Foreign Application Priority Data

Aug. 7, 2000 (EP) .............................. 00202782

(51) Int. Cl.[7] ................................. H03F 3/68
(52) U.S. Cl. ...................... 330/295; 330/311; 330/254; 330/286; 330/277
(58) Field of Search ................. 330/295, 311, 330/252, 265, 343

(56) References Cited

U.S. PATENT DOCUMENTS

| | | | | |
|---|---|---|---|---|
| 3,748,588 A | * | 7/1973 | Beurrier | ....................... 330/295 |
| 3,863,168 A | * | 1/1975 | Beurrier | ....................... 330/295 |
| 3,911,372 A | * | 10/1975 | Seidel | ....................... 330/295 |
| 4,631,492 A | * | 12/1986 | Magarshack et al. | ........ 330/295 |
| 5,352,989 A | * | 10/1994 | Toumazou et al. | ........... 330/265 |
| 5,436,594 A | * | 7/1995 | Pace et al. | .................... 330/258 |
| 5,521,554 A | | 5/1996 | Okazaki | ...................... 330/306 |
| 6,522,203 B1 | * | 2/2003 | Tiren et al. | ................... 330/295 |

FOREIGN PATENT DOCUMENTS

| | | | | |
|---|---|---|---|---|
| EP | 0387951 | | 3/1990 | ............. H03F/3/30 |
| EP | 0 729 225 A1 | * | 1/1996 | ................. 330/343 |
| EP | 0729225 A1 | | 2/1996 | ........... H03F/3/343 |
| WO | WO9611528 | | 4/1996 | |

* cited by examiner

*Primary Examiner*—Michael Tokar
*Assistant Examiner*—Lam T. Mai
(74) *Attorney, Agent, or Firm*—Russell Gross

(57) ABSTRACT

An amplifier, in particular an RF amplifier is described having an amplifier input, the amplifier comprises: a first controllable semiconductor having a first controllable mainstream path coupled to first source means for controlling the first mainstream path, and having a first biased control input; and a second controllable semiconductor having a second controllable mainstream path coupled to second source means for controlling the second mainstream path, and having a second control input coupled to the first main stream path and to the amplifier input. Both the first and second mainstream paths are coupled to a common load, and the first and second source means are arranged for controlling input impedance and noise impedance respectively of the amplifier input. This amplifier arrangement allows independent control and optimisation of both the amplifier input impedance and the noise impedance.

10 Claims, 3 Drawing Sheets

NOISE AND INPUT IMPEDANCE MATCHED AMPLIFIER

The present invention relates to an amplifier having an amplifier input, the amplifier comprising: —a first controllable semiconductor having a first controllable mainstream path coupled to first source means for controlling the first mainstream path, and having a first biased control input; and —a second controllable semiconductor having a second controllable mainstream path coupled to second source means for controlling the second mainstream path, and having a second control input coupled to the first main stream path and to the amplifier input.

The present invention also relates to a communication device provided with an antenna amplifier, optical amplifier, low noise amplifier, RF mixer, hard-disk drive read amplifier, GSM or DECT device, and the like, which communication device is provided with such an amplifier.

Such an amplifier is known from WO 96/11528. The amplifier arrangement known therefrom comprises a first transistor as a controllable semiconductor having a first collector emitter mainstream path coupled to a first current source for controlling the first mainstream path, and a having first biased control input; and comprises a second transistor having a second collector emitter mainstream path coupled to a second current source for controlling the second mainstream path, and having a second control input coupled to the first main stream path and to the amplifier input. In an embodiment the first transistor is anti-parallel connected to a further transistor between two outputs of the amplifier. In series with the second transistor there is a still further transistor taking over the control from the second transistor in case of a large signal excursion due to a large amplifier input signal. Thus it is ensured that all transistors remain biased irrespective actual input signal excursions, which reduces signal distortion of the amplifier.

It is a disadvantage of the known amplifier that matching of an input signal source, which provides the input signal and an input section of the amplifier concerned is not optimal, as a consequence of which input impedance and input noise characteristics respectively each lack appropriate matching, which degrades performance characteristics of the amplifier and/or corresponding communication device provided therewith.

Therefore it is an object of the present invention to provide an amplifier and communication device, whose input impedance and input noise characteristics are both optimally matched to the characteristics of the input signal source of the amplifier.

Thereto the amplifier and communication device according to the invention are characterised in that both the first and second mainstream paths are coupled to a common load, and that the first and second source means are arranged for controlling input impedance and noise impedance respectively of the amplifier input.

It is an advantage of the amplifier according to the present invention that it has been found that by independent control of each of the individual first and second source means a virtually independent input impedance and noise impedance control can respectively be achieved. Consequently optimisations of both input impedance and noise impedance can be reached separately. Because power matching is related to impedance matching, the former matching is also possible. Even dynamic and adaptive matching of each of these impedances is feasible in a simple way, without any operational stability problems raising feedback structures being necessary therefor.

An embodiment of the amplifier according to the invention is characterised the amplifier is an RF amplifier.

Advantageously even broadband RF input impedance matching is possible, such that the amplifier gain is more constant over a larger frequency band, whereby antenna sizes may be decreased, because in particular low noise operation at lower impedances requires smaller antennas. These smaller antennas can thus be integrated more easily on chip or in a casing of mobile or portable telephones.

A further alternative and easy to implement embodiment of the amplifier according to the invention is characterised in that the amplifier comprises a third controllable semiconductor, whose third mainstream path is connected in series with the second mainstream path of the second controllable semiconductor, and having a third control input which is coupled to the first biased control input.

Generally the controllable semiconductors are transistors, in particular embodied by MOS, such as P-MOS or N-MOS, or bipolar NPN or PNP transistors, which are widely available and easy to integrate on only a limited IC chip area.

In a differential configuration of a communication device it may be preferred to have an amplifier according to the invention be characterised in that the amplifier is embodied as a differential amplifier.

At present the amplifier according to the invention will be elucidated further together with its additional advantages while reference is being made to the appended drawing, wherein similar components are being referred to by means of the same reference numerals. In the drawing.

Figure 1:
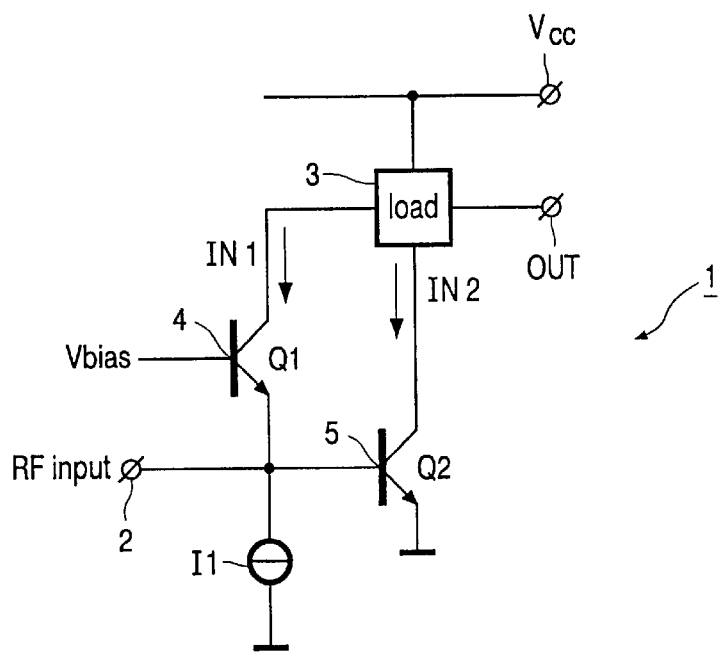
FIG. 1 shows an embodiment of the amplifier according to the invention.

FIG. 1 shows an amplifier 1, which is provided with an input 2, such as for an RF input signal from a signal source (not shown) and an output shown as output OUT of a load 3. The load 3 is coupled to a power supply voltage Vcc at the one hand and to both main stream paths IN1 and IN2 of respective controllable semiconductor circuits Q1 and Q2. The controllable semiconductor circuits Q1 and Q2 are shown as transistors Q1 and Q2, in particular NPN transistors; they may be for example be MOS or bipolar controllable semiconductors. Each controllable semiconductor Q1, Q2 has a respective control input 4, 5, here the respective bases of transistors Q1 and Q2. Control input 4 is coupled to a bias source (not shown) providing a voltage Vbias, such that Q1 is connected in a common base circuit. Control input 5 is coupled to the main stream path IN1 of transistor Q1. Here the main stream paths are the respective collector-emitter junctions. In case of MOS transistors of Q1 and Q2 the control inputs are their gates, and the main stream paths are the drain-source junctions thereof. Input 2, together with control input 5 is coupled between first control source means, here shown as a current source I1 for controlling the current in the first main stream path IN1, and earth. The current adjustment in the second main stream path IN2 takes place by appropriate second source means I2. These means I2 may at least partly be incorporated in the load 3, or may for example be embodied by a current source, such as the current source I2 shown in FIG. 4, or may be embodied by a voltage source (not shown) which is to be coupled to the control input 5. It has been found in practice and corresponding extensive calculations revealed that the input impedance and the optimal noise impedance both at input 2 can to a large extent be influenced independently from one another by the source means I1 and I2 respectively. Consequently optimising the input impedance seen at input 2 for an optimum power/input match between the input source (not shown) and the amplifier input impedance at input 2 does not substantially influence noise impedance characteristics seen at input 2 of the amplifier 1. Thus noise impedance characteristics for achieving a minimum noise figure in the operating frequency band of the amplifier 1 can be optimised as well. It is known and noted here that input and noise impedance are generally always different from one another and could till now not both be optimised simultaneously in an amplifier circuit.

Figure 2:
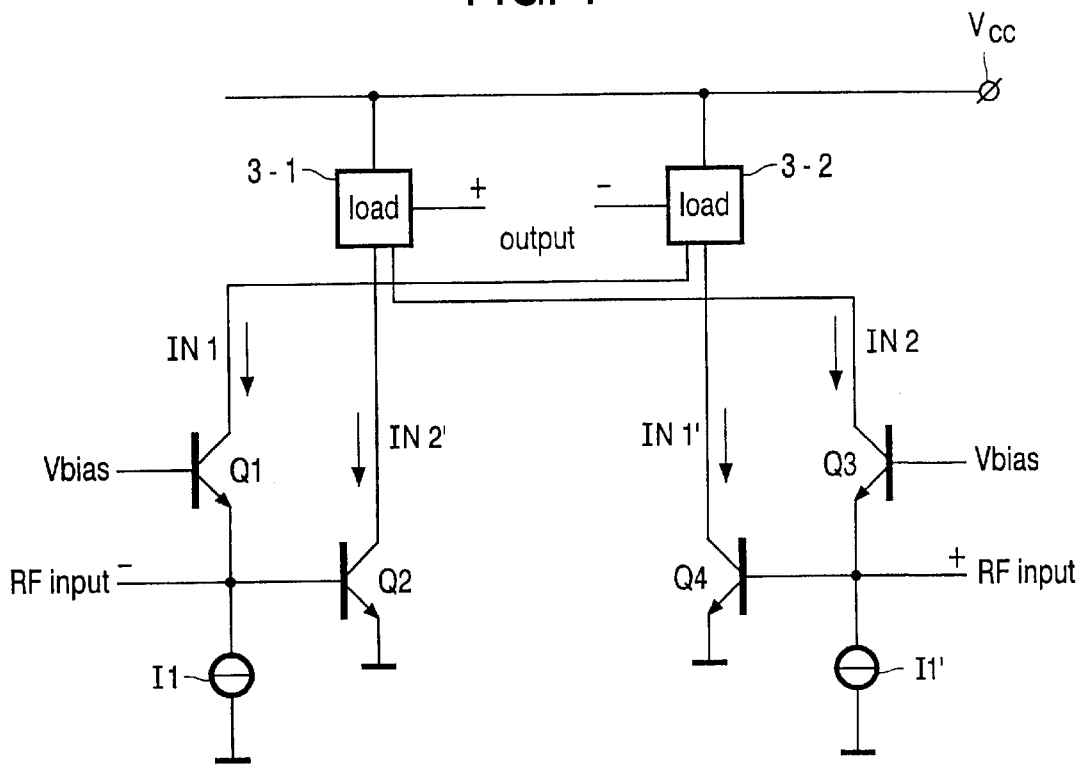
FIG. 2 shows a further embodiment of the amplifier according to the invention which is embodied as a differential amplifier.

FIG. 2 shows a differential amplifier arrangement, whereby the amplifier circuit of FIG. 1 is essentially mirrored. Q1 is mirrored in Q3, while Q2 is mirrored in Q4, and I1 is mirrored in I1' to form corresponding mainstream paths IN1, IN1', IN2 and IN2'. The differential loads 3-1 and 3-2 are crosswise coupled here to expose a differential output of the amplifier 1. Function and features of the embodiment of FIG. 2 are the same as those of the embodiment of FIG. 1.

Figure 3:
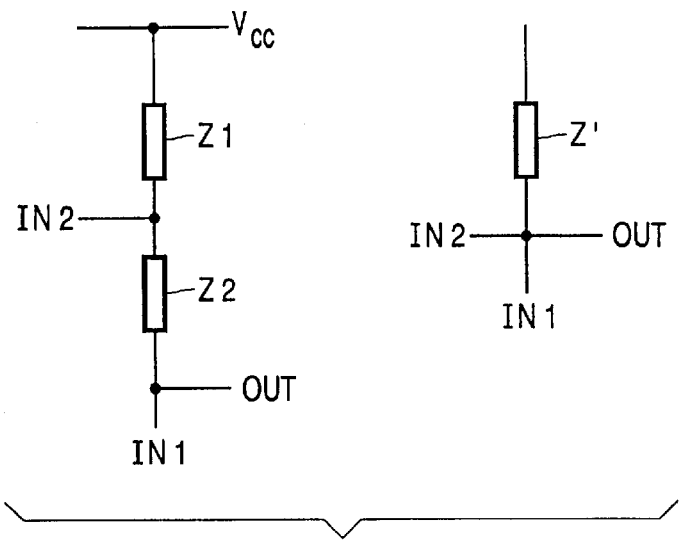
FIG. 3 shows various load configurations for application in the amplifier according to the invention.

FIG. 3 shows some possible configurations of the loads 3, 3-1 and 3-2. The series arrangement of FIG. 3, together with the load as shown in the embodiment of FIG. 4 provides additional possibilities for tailoring the features of the amplifier 1 by proper choice of the component values, in particular the impedance values of impedances Z1, Z2 and Z'.

Figure 4:
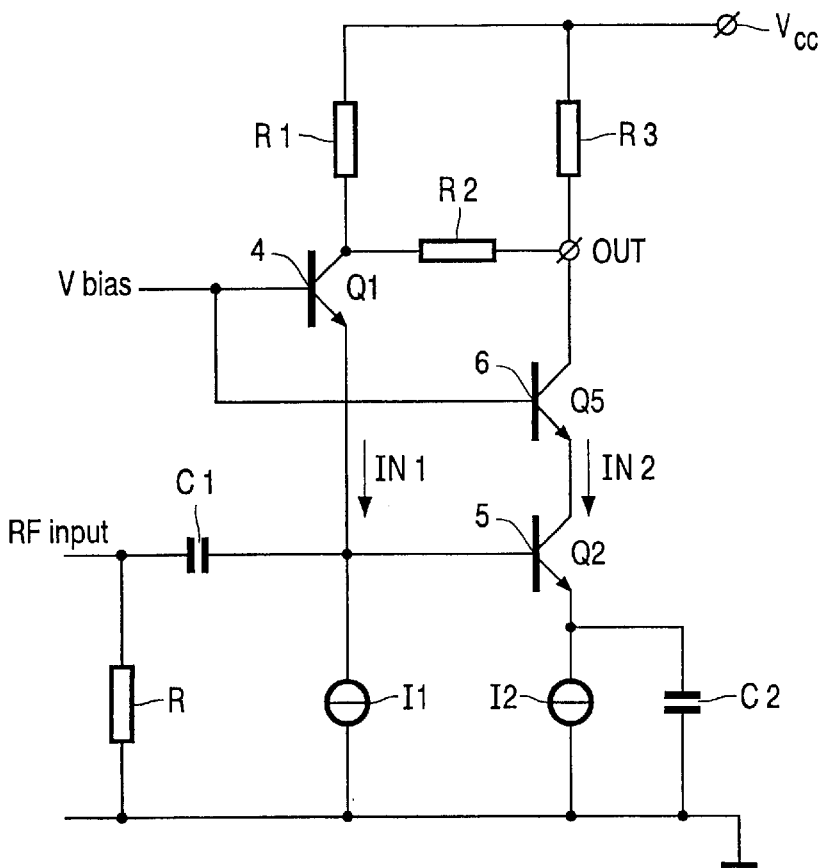
FIG. 4 shows a still further detailed embodiment of the amplifier according to the invention.

FIG. 4 shows a more detailed circuit diagram of a further embodiment of the amplifier 1. The amplifier 1 elucidated herein has a load in form of a II circuit. The II circuit comprises resistors R1, R2 and R3, coupling both main stream paths IN1 and IN2. A load transistor Q5 is included in the main stream path IN2 whose control base input 6 is also biased to form a common base circuit parallel to the common base circuit formed by controllable semiconductor Q1. An AC coupling capacitor C1 is coupled between the RF input and control input 5 of transistor Q2, and capacitor C2 AC decouples current source means I2.

Figure 5:
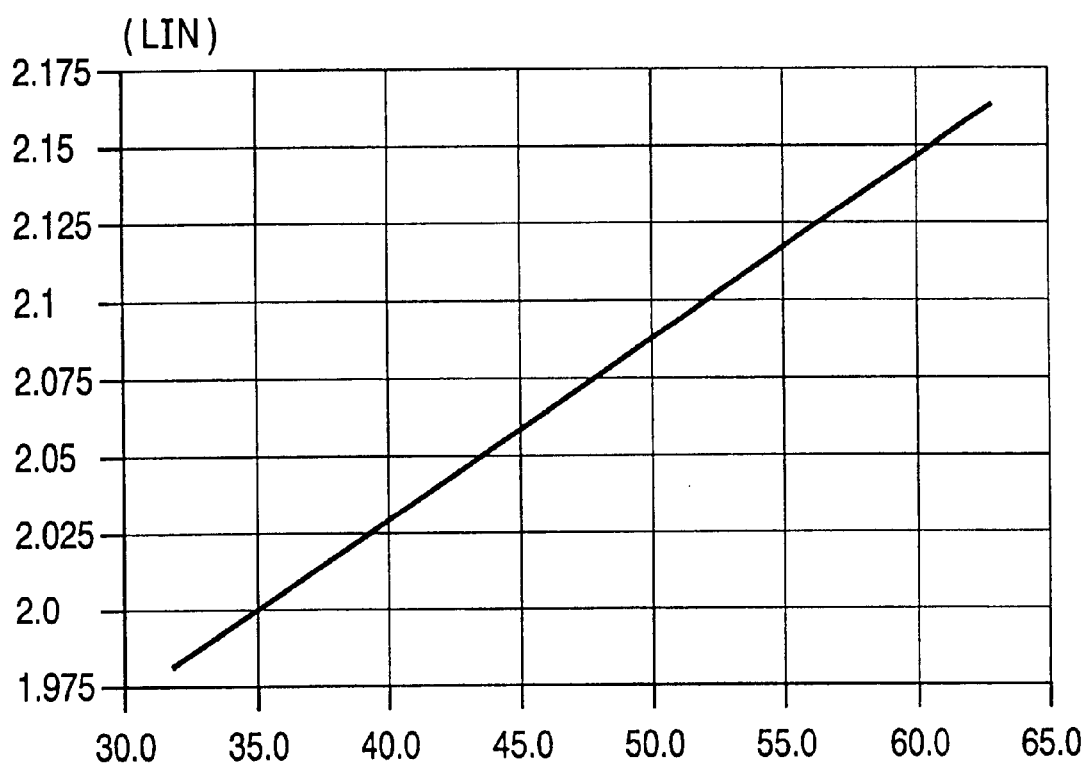
FIG. 5 shows a graph of the noise figure of the amplifier according to the invention as a function of its input impedance.

FIG. 5 shows a graph which results from measurements on the amplifier 1 showing the noise figure measured at output OUT as a function of the input impedance at input 2. It shows that where the noise number varies some 10% the input inpedance varies more than 30 dB, which means that both quantities are virtually independent from one another, which enables independent control and individual optimisation of these quantities.

Whilst the above has been described with reference to essentially preferred embodiments and best possible modes it will be understood that these embodiments are by no means to be construed as limiting examples of the devices concerned, because various modifications, features and combination of features falling within the scope of the appended claims are now within reach of the skilled person.

What is claimed is:

1. An amplifier having an amplifier input, the amplifier comprising:
    a first controllable semiconductor having a first controllable mainstream path coupled to first source means for controlling the first mainstream path, and having a first biased control input; and
    a second controllable semiconductor having a second controllable mainstream path coupled to second source means for controlling the second mainstream path, and having a second control input coupled to the first main stream path and to the amplifier input, characterised in that both the first and second mainstream paths are coupled to a common load, and that the first and second source means are arranged for controlling input impedance and noise impedance respectively of the amplifier input.

2. The amplifier according to claims 1, characterised in that the amplifier is an RF amplifier.

3. The amplifier according to claims 1, characterised in that the amplifier comprises a third controllable semiconductor, whose third mainstream path is connected in series with the second mainstream path of the second controllable semiconductor, and having a third control input which is coupled to the first biased control input.

4. The amplifier according to the claims 1, characterised in that the controllable semiconductors are transistors.

5. The amplifier according to claim 4, characterised in that the transistors are embodied by MOS or bipolar transistors.

6. The amplifier according to claim 5, characterised in that the transistors are N-MOS or P-MOS transistors.

7. An amplifier having an amplifier input, the amplifier comprising:
    a first controllable semiconductor having a first controllable mainstream path coupled to first source means for controlling the first mainstream path, and having a first biased control input; and
    a second controllable semiconductor having a second controllable mainstream path coupled to second source means for controlling the second mainstream path, and having a second control input coupled to the first main stream path and to the amplifier input,
    both the first and second mainstream paths are coupled to a common load, and that the first and second source means are arranged for controlling input impedance and noise impedance respectively of the amplifier input, wherein the transistors are NPN or PNP transistors.

8. The amplifier according to claim 1, characterised in that the amplifier is embodied as a differential amplifier.

9. The amplifier according to claims 1, characterised in that the first and/or second source means at least comprise(s) a current source.

10. A communication device, such as an antenna amplifier, optical amplifier, low noise amplifier, RF mixer, hard-disk drive read amplifier, GSM or DECT device, and the like, characterised in that the communication device comprises an amplifier according to one of the claims 1–9.

* * * * *